United States Patent [19]

Yamaha

[11] Patent Number: 5,786,638
[45] Date of Patent: Jul. 28, 1998

[54] SEMICONDUCTOR DEVICE WITH MOISTURE IMPERVIOUS FILM

[75] Inventor: Takahisa Yamaha, Hamamatsu, Japan

[73] Assignee: Yamaha Corporation, Japan

[21] Appl. No.: 869,672

[22] Filed: Jun. 5, 1997

Related U.S. Application Data

[60] Continuation of Ser. No. 466,105, Jun. 6, 1995, abandoned, which is a division of Ser. No. 166,548, Dec. 14, 1993, Pat. No. 5,733,797.

[30] Foreign Application Priority Data

Dec. 16, 1992 [JP] Japan .................... 4-354402

[51] Int. Cl.$^6$ .............................. H01L 23/58; H01L 23/48
[52] U.S. Cl. .......................... 257/760; 257/641; 257/758
[58] Field of Search ........................... 257/641, 760, 257/759, 758, 637

[56] References Cited

U.S. PATENT DOCUMENTS

| | | | |
|---|---|---|---|
| 4,668,973 | 5/1987 | Dawson et al. | 257/641 |
| 5,461,254 | 10/1995 | Tsai et al. | 257/646 |
| 5,552,628 | 9/1996 | Watanabe et al. | 257/760 |

OTHER PUBLICATIONS

"Application of Surface Reformed Thick Spin–on–Glass to MOS Device Planarization", Shinichi Ito et al., J. Electrochem. Soc., vol. 137, No. 4, pp. 1212–1218, Apr. 1990.

"Correlation Between Dielectric Reliability and Compositional Characteristics of PECVD Oxide Films", B. van Schravendijk et al., pp. 372–377, 1992 ISMIC–101/92/00372, Jun. 9–10, 1992 VMIC Conference.

"Product Specifications", Filmtronics Semiconductor Process Materials, Filmtronics, Inc. pp. 18–19.

"Moisture–Blocking Mechanism of ECR–Plasma SiO2 and High Reliable Performance of Multilevel Al Metalization", M. Doki et al., pp. 235–239, Jun. 7–8, 1994 VMIC Conference.

"Field Inversion in CMOS Double Metal Circuits Induced by Water From Outside", Takahisa Yamaha et al., pp. 302–304, Jun. 8–9, 1993 VMIC Conference.

*Primary Examiner*—Donald Monin
*Attorney, Agent, or Firm*—Ostrolenk, Faber, Gerb & Soffen, LLP

[57] ABSTRACT

A moisture impervious film 24 such as silicon nitride is formed under an interlayer insulating film, covering the active region of an IC chip. The interlayer insulating film is formed, for example, by lamination of a silicon oxide film, a spin-on-glass (SOG) film, and another silicon oxide film. Moisture ($H_2O$) is intercepted by the moisture impervious film and does not reach the active region. It is possible to avoid the conductivity type inversion at the surface of a p-type well region in the active region and to suppress the corrosion of wiring layers, improving the reliability of the IC chip. The moisture impervious film is not limited to be formed at the layer under the silicon oxide film, but it is sufficient only if the film is formed at the layer under the SOG film.

18 Claims, 3 Drawing Sheets

SEMICONDUCTOR DEVICE WITH MOISTURE IMPERVIOUS FILM

This is a continuation of application Ser. No. 08/466,105 filed on Jun. 6, 1995, now abandoned, which is a division of application Ser. No. 08/166,548, filed Dec. 14, 1993, now U.S. Pat. No. 5,733,797.

BACKGROUND OF THE INVENTION a) Field of the Invention

The present invention relates to a semiconductor device with an integrated circuit (IC) chip, and more particularly to a semiconductor integrated circuit device capable of preventing moisture in a spin-coated insulating layer constituting an interlayer insulating film from permeating into an active region.

b) Description of the Related Art

As a protective structure for IC chips, there is known a seal ring structure such as shown in FIGS. 2 and 3. FIG. 2 is a cross section, and FIG. 3 is a plan view.

In FIGS. 2 and 3, a plurality of inner chip regions 30A, 30B are formed on the surface of a semiconductor substrate 10. Each inner chip region includes ICs formed by a number of circuit elements and wirings. The peripheral region of the inner chip region is formed with a seal ring structure such as shown in FIG. 2 for preventing the invasion of moisture and impurities from the external environment.

The seal ring structure is formed surrounding each inner chip region 30A, 30B and covering the edge portion of a field insulating film 12 formed on the substrate surface. The seal ring is formed by a first interlayer insulating film 14, a first wiring layer 16, a second interlayer insulating film 18, a second wiring layer 20, and a protective insulating film 22 sequentially in this order from the bottom. The wiring layers 16 and 20 are formed when forming first and second wiring layers in the internal chip regions, but are electrically separated from the latter. A silicon nitride film formed by a plasma CVD (Chemical Vapor Deposition) is often used as the protective insulating film 22.

The substrate 10 in the form of a wafer formed with internal chip regions 30A, 30B and their peripheral seal ring structures, is diced along crossing scribe regions 32A and 32B shown in FIG. 3 and divided into separate IC chips.

With this conventional technique, however, as shown in FIG. 3, a scratch X reaching the internal chip region 30A nay sometimes be formed when dicing the substrate. FIG. 4 shows an IC chip 30 having the insulating films 12, 14, and 18 exposed at the chip side wall 30E because of the scratch X. In FIG. 3, like elements to those shown in FIG. 2 are represented by identical reference numerals.

Referring to FIG. 4, on the surface of an n-type semiconductor substrate 10, there is formed a p-type well region 10W. On the surface of the well region 10W, AMOS transistors Ta, Tb of an LDD (Lightly Doped Drain) type are formed in a tub region surrounded by the field insulating film 12. A region 30a in which IC circuit elements such as transistors Ta, Tb are formed, is called an active region.

The first interlayer insulating film 14 is disposed between the gate electrode layers 13G of transistors Ta and Tb and the first wiring layers 16S and 16D on the source/drain regions, and made of, for example, BPSG (boron phospho silicate glass). The wiring layers 16S and 16D are used as the source and drain wirings, respectively.

The second interlayer insulating film 18 is disposed between the first wiring layers 16S and 16D and the second wiring layers 20D. For example, this film 18 has a laminated structure of a silicon oxide film 18a, a generally flat spin-on-glass (SOG) film 18b formed on the film 18a by spin-coating SOG, and another silicon oxide film 18c formed on the SOG film. The wiring layer 20D is electrically connected to the wiring layer 16D via a contact hole 18P formed in the insulating film 18, and used as the drain wiring.

If the SOG film 18b exposes at the chip side wall, moisture may sometimes permeate into the SOG film when severing the wafer. Permeated moisture diffuses from the SOG film 18b downward to the underlie field insulating film 12, causing a malfunction of transistors Ta, Tb.

In order to eliminate such defects, it is possible to make the scratch not reach the seal ring structure by widening the width of the scribe regions 32A, 32B, generally of about 100 μm. However, this approach is not practical because the number of chips per one wafer is reduced.

SUMMARY OF THE INVENTION

It is an object of the present invention to provide a novel semiconductor device capable of preventing moisture at a scratch from permeating into the active region, without widening the width of a scribe region.

According to one aspect of the present invention, there is provided a semiconductor device having a semiconductor substrate, a plurality of circuit elements formed on the surface of the semiconductor substrate at predetermined active regions, a laminated wiring layer having a plurality of wiring layers and a plurality of interlayer insulating films respectively formed on the surface of the substrate, the circuit elements and the plurality of wiring layers and interlayer insulating films constituting an integrated circuit, one of the interlayer insulating films being formed by a generally flat spin-coated insulating film covering the active region and reaching the side wall of the substrate or near the side wall, and a protective insulating film covering the laminated wiring layer, wherein a moisture impervious film is formed at the layer lower than the spin-coated insulating film, the moisture impervious film covering the active region.

The moisture impervious film is formed at the layer lower than the spin-coated insulating film such as an SOG film constituting the interlayer insulating film, to prevent moisture from being permeating into the active region. Accordingly, even if the spin-coated insulating film such as an SOG film exposes at the chip side wall because of a scratch formed when dicing, moisture permeating from the exposed area of the spin-coated insulating film is intercepted by the moisture impervious film and does not reach the active region. It is also possible to prevent the conductivity type inversion and wiring corrosion within a chip, realizing a high reliability IC device.

It is also unnecessary to widen the width of the scribe region, avoiding a reduction in the number of chips per wafer.

DETAILED DESCRIPTION OF THE PREFERRED EMBODIMENTS

Figure 1:
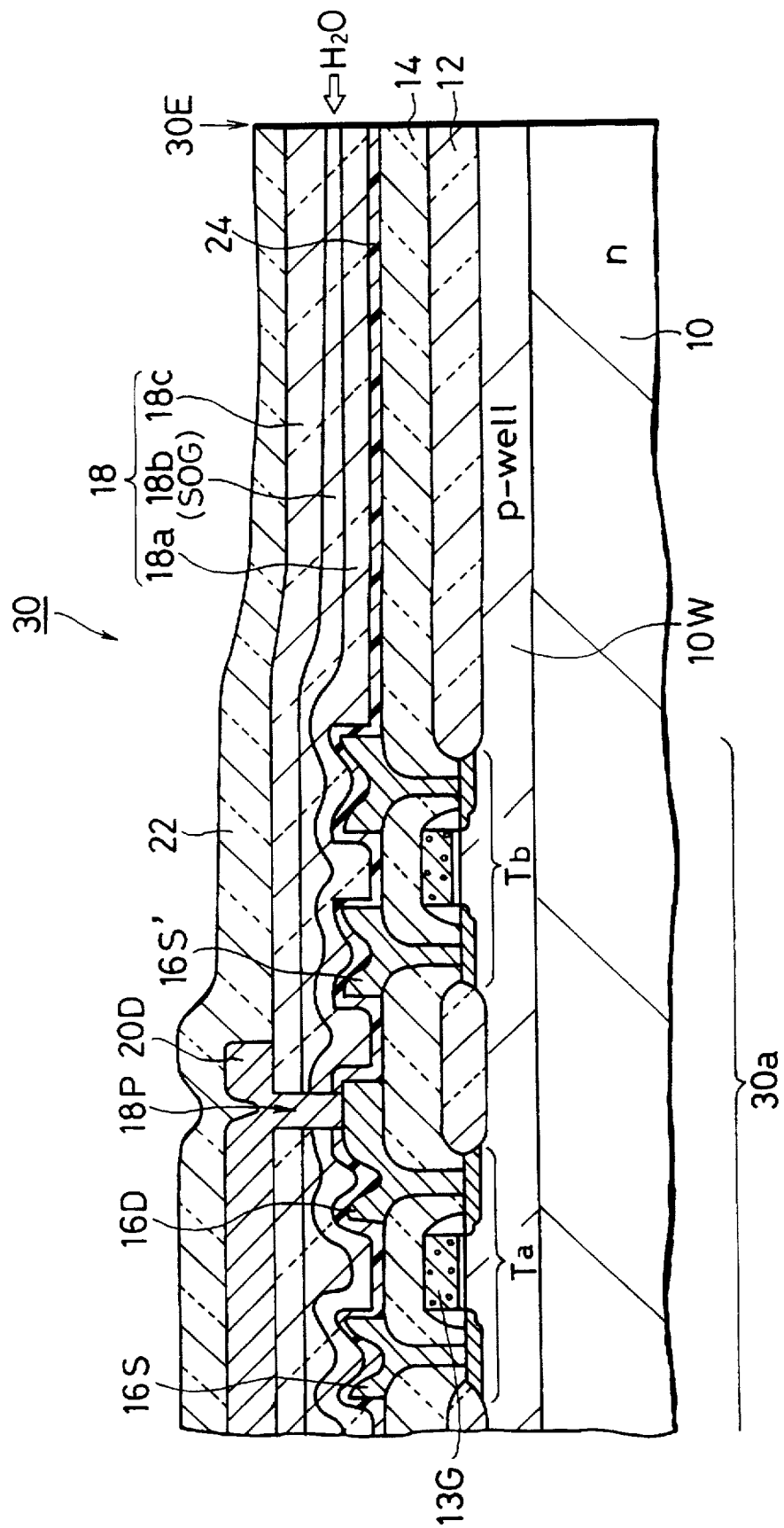
FIG. 1 is a cross section of the substrate of an IC chip according to an embodiment of the present invention.
Figure 4:
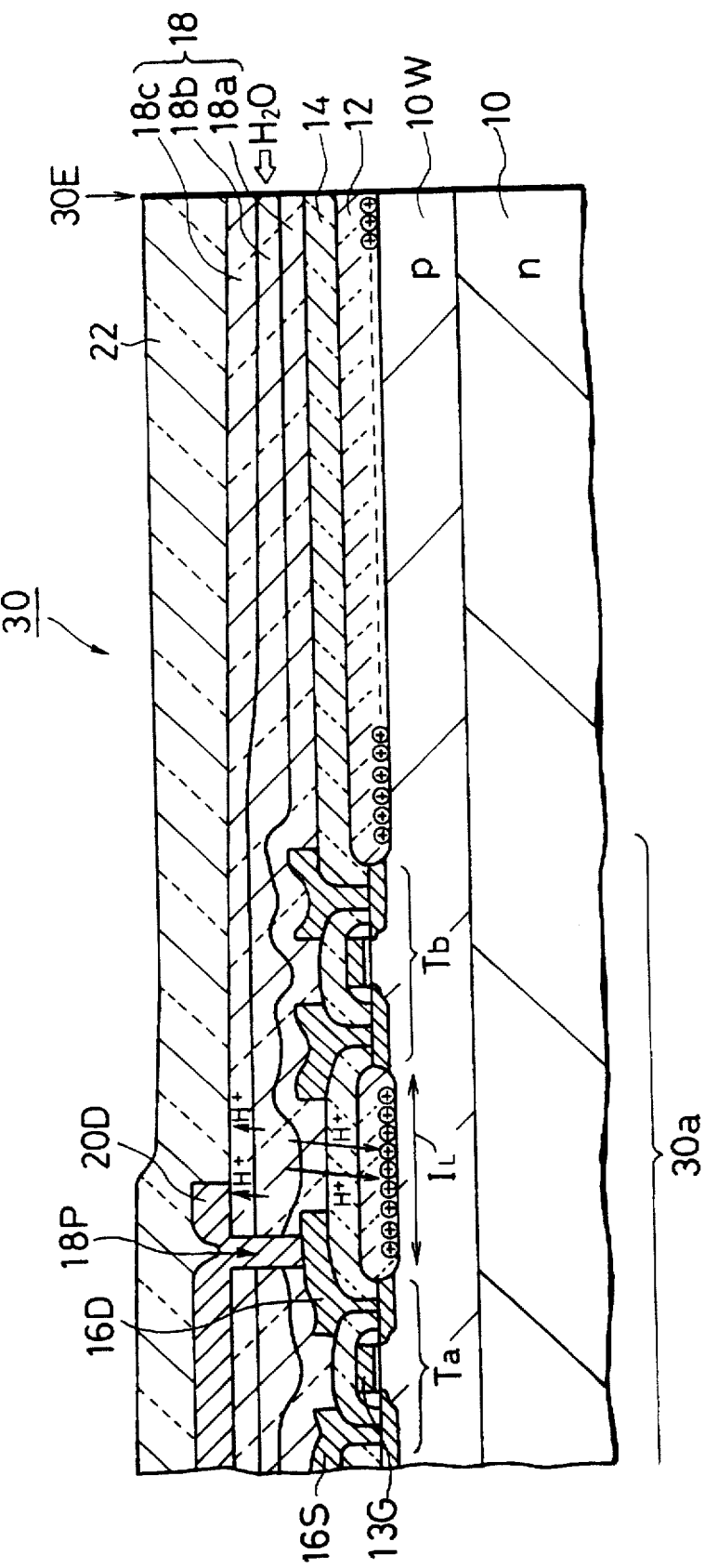
FIG. 4 is a cross section of the substrate of a conventional IC chip, explaining a conductivity type inversion phenomenon.

FIG. 1 shows an IC chip according to an embodiment of the invention, wherein like elements to those shown in FIG. 4 are represented by identical reference numerals and the description thereof is omitted.

An IC chip 30 includes an n-type semiconductor substrate 10, a p-type well region 10W, a field insulating film 12, and the like. In an active region 30a, there are formed circuit elements such as MOS transistors Ta, Tb of an LDD structure.

PSG and BPSG are deposited in this order on the upper surface of the substrate to the thicknesses of 100 nm and 600 nm, respectively. Thereafter, BPSG is heated to 1000° C. to flow it and form a first interlayer insulating film. After necessary contact holes are formed in the first interlayer insulating film 14, WSi, Al alloy (e.g., Al—Si—Cu), and WSi, are coated in this order on the upper surface of the substrate by means of sputtering or the like. The coated layer is patterned to form first wiring layers 16S, 16D, and 16S'. The wiring layers 16S and 16D are used as the source and drain wirings for the transistor Ta, and the wiring layer 16S' is used as the source Pairing of the transistor Tb.

Next, silicon nitride is deposited on the upper surface of the substrate to the thickness of 100 nm by a plasma CVD to form a moisture impervious film 24. This film 24 may be made of a silicon nitride film formed by sputtering.

In the present specification, a moisture impervious film is defined as a film protecting a downward moisture diffusion to the underlayered transistors and to the field oxide film. As a result of prevention of the downward moisture diffusion, it suppresses malfunction of isolation function of the field oxide film.

Next, a second interlayer insulating film 18 is formed on the upper surface of the substrate. Specifically, a silicon oxide film 18a is formed to the thickness of 400 nm by a plasma CVD, a spin-on-glass (SOG) film 18b is spin-coated to the thickness of about 300 nm and cured at a temperature of 400° C. and thereafter, another silicon oxide film 18c is formed to the thickness of 400 nm by a plasma CVD.

Next, by using a photoresist film as a mask, a contact hole 18P is formed in the interlayer insulating film 18 and moisture impervious film 24 to the surface of the wiring layer 16D.

Next, Al alloy (e.g., Al—Si—Cu) is deposited on the upper surface of the substrate by sputtering technique. The Al-alloy layer is patterned to form a wiring layer 20D.

Figure 2:
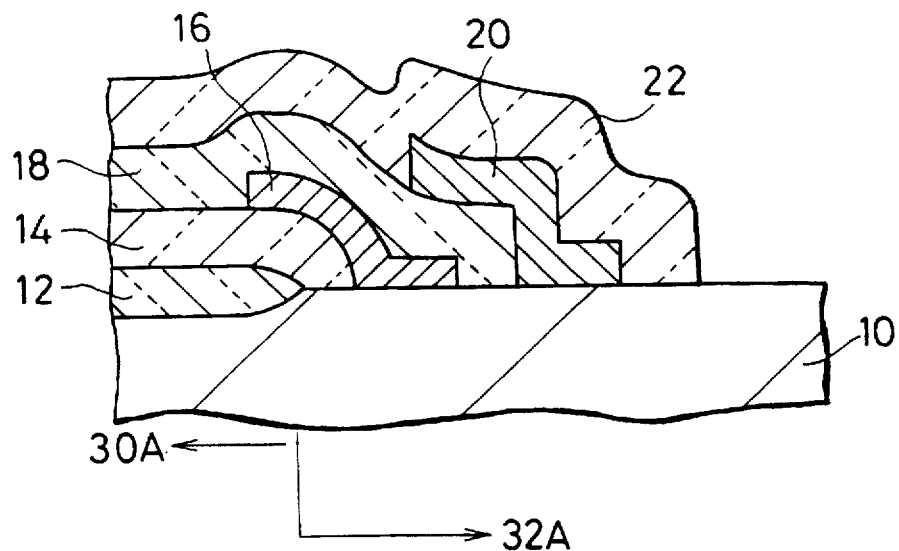
FIG. 2 is a cross section showing a conventional IC chip protective structure.

Thereafter, silicon nitride is deposited on the upper surface of the substrate to form a passivation film 22. At the peripheral area of each internal chip region, the seal ring structure and its manufacturing processes such as explained with FIG. 2 are used. In this case, wiring layers 16 and 20 are formed by the same processes as for the wiring layers 16S and 16D.

Figure 3:
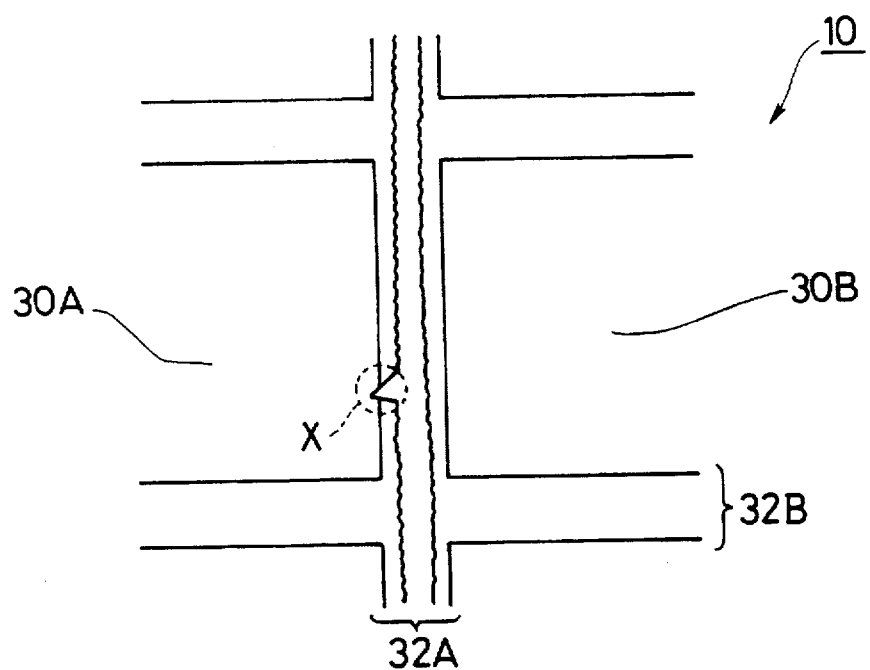
FIG. 3 is a plan view showing the layout of active regions on the surface of a substrate.

The finished substrate in the form of a wafer is diced along the scribe regions such as shown in FIG. 3 to form separated IC chips 30.

If the SOG film 18b exposes at the chip side wall 30E, moisture (H2O) may sometimes permeate externally from the SOG film 18b to the inside of the chip if the moisture impervious film 24 were not provided. A probability of moisture permeation becomes very great, particularly when using organic SOG. Permeated moisture diffuses rapidly in the SOG film 18b downward to the active region 30a. Moisture (hydrogen atoms) diffused in the SOG film 18b gradually diffuses downward, gene rating positive fixed electric charges in the field insulating film 12. As a result, negative electric charges are induced in the p-type well region 10W to invert the conductivity type to an n-type. Therefore, a leakage current IL flows, for example, through the transistors Ta and Tb, hindering the normal operation of the transistors.

However, with the provision of the moisture impervious film 24, even if a scratch X such as shown in FIG. 3 is formed when dicing and the interlayer insulation film 18 exposes at the side wall 30E of the chip, moisture ($H_2O$) externally permeated into the SOG film 18b can be intercepted by the moisture impervious film 24, preventing the moisture from reaching the active region 30a. Accordingly, no conductivity type inversion will occur at the surface of the well region 10W, and no leakage current will flow.

The patterned electrodes 16 such as aluminum electrodes have sharp edges, and cracks may be formed on the CVD $SiO_2$ film 18a over such sharp edges. Also in this case, moisture permeated in the SOG film 18b can be intercepted by the overlying nitride film 24. In order to protect the AL electrodes from corrosion caused by permeated moisture, it is preferable to form the nitride film directly on the AL electrodes.

A leakage current between the wiring layers 20D and 16S' was measured by applying 0 V to the well region 10W and wiring layer 16S' and 0.2 V to the wiring layer 20D. 100 samples of the embodiment shown in FIG. 1 and 100 samples of the conventional structure shown in FIG. 4 were prepared. The samples were placed for 100 hours in a test chamber (140° C., 85% RH) of a pressure cooker test instrument. The leakage currents were measured before and after the 100-H exposure, and the results shown in Table 1 were obtained.

TABLE 1

|  | Embodiment Samples | Conventional Samples |
|---|---|---|
| Before Exposure | ≦0.1 pA | ≦0.1 pA |
| After Exposure | ≦0.1 pA | 100 pA to 10 nA |

As seen from the test results shown in Table 1, the present invention presents a great effect of suppressing a leakage current.

Moisture is prevented from permeating into the wiring layers 16S, 16D, and 16S' in the structure shown in FIG. 1, suppressing the wiring corrosion. Another moisture impervious film like the film 24 may be formed at the layer lower than the second wiring layer 20D and higher than the SOG film 18b, in order to suppress the corrosion of the wiring layer 20D.

In the above embodiment, although the moisture impervious film 24 has been formed under the interlayer insulating film 18, the position of the layer 24 is not limited to it so long as it is formed at the layer lower than the SOG film 18b and higher than the electrode layer 13G. For example, the moisture impervious layer 24 may be formed at the layer lower or higher than the first interlayer insulating film 14, or may be formed in the film 14. In the case of the moisture impervious film 24 over the insulating film 14, if a sputtered silicon nitride film which has rarely a film stress is used as the moisture impervious film 24, the hot carrier resistance can be prevented from being lowered by a film stress.

I claim:

1. a semiconductor device comprising:
   a) a semiconductor substrate having a surface and a side wall;
   b) a plurality of circuit elements formed on the surface of said semiconductor substrate at predetermined active regions;
   c) a laminated wiring layer having a plurality of wiring layers and an interlayer insulating film between each pair of adjacent wiring layers formed on the surface of said substrate, said circuit elements and said plurality of wiring layers and interlayer insulating film constituting an integrated circuit, said interlayer insulating film comprising a first oxide film formed in a plasma ambient, a generally flat spin-coated insulating film on said first oxide film, and a second oxide film formed over the generally flat spin-coated insulating such as to cover said active region and reach the side wall of said substrate or near said side wall;
   d) a protective insulating film covering said laminated wiring layer; and
   e) a moisture impervious film formed at a level lower than said spin-coated insulating film, said moisture impervious film being formed to cover said active region and being formed at least partly directly on said laminated wiring layer, said first oxide film being formed on and in contact with said moisture impervious film.

2. A semiconductor device according to claim 1, wherein moisture impervious film comprises silicon nitride.

3. A semiconductor device according to claim 1, wherein the moisture impervious film covers an entire surface of an underlayer structure.

4. A semiconductor device comprising:
   a) a semiconductor substrate;
   b) an underlayer structure formed on the semiconductor substrate, the underlayer structure having a first transistor, a second transistor, an isolation region formed therebetween for isolating the first and second transistors and a wiring layer;
   c) a moisture impervious film formed over the underlayer structure to cover the underlayer structure, the moisture impervious film being formed at least partly directly on the wiring layer and protecting moisture diffusion from above down to the underlayer structure, which moisture diffusion might cause malfunction of the isolation region; and
   d) a first interlayer insulating film formed over the moisture impervious film, the first interlayer insulating film including a first oxide film formed on and in contact with said moisture impervious films, said first oxide film being formed in a plasma ambient, a spin-coated insulating material layer having an affinity for moisture formed on said first oxide film, said spin-coated insulating layer causing downward moisture diffusion to the underlayer structure, and a second oxide film formed over said spin-coated insulating film.

5. A semiconductor device according to claim 4, wherein the moisture impervious film comprises silicon nitride.

6. A semiconductor device according to claim 5, further comprising:
   (b-1) a second interlayer insulating film over the underlayer structure, wherein the moisture impervious film is provided on the second interlayer insulating film.

7. A semiconductor device according to claim 6, further comprising:
   (b-2) a metal wiring formed through the second interlayer insulating film contacting the first and second transistors.

8. A semiconductor device according to claim 4, further comprising a metal wiring provided in the underlayer structure and a contact hole formed through the first interlayer insulating film and the moisture impervious film to expose the metal wiring.

9. A semiconductor device according to claim 4, wherein the thicknesses of the first and second oxide films are about 400 nm, and the thickness of the spin-on-glass film is about 300 nm.

10. A semiconductor device according to claim 4, wherein the spin-on-glass film comprises organic spin-on-glass material.

11. A semiconductor device according to claim 4, wherein the moisture impervious film covers the entire surface of the underlayer structure.

12. A semiconductor device comprising:
   a) a semiconductor substrate;
   b) an underlayer structure formed on the semiconductor substrate, the underlayer structure having a first device element, a second device element, and an isolation region provided therebetween for isolating the first and second device elements;
   c) a laminated insulating layer over the underlayer structure to cover the underlayer structure, comprising:
      (c-1) a moisture impervious film formed over the underlayer structure to cover the underlayer structure; and
      (c-2) a first interlayer insulating film formed over the moisture impervious film, the first oxide film formed over and in contact with the moisture impervious film, the first oxide film being formed in a plasma ambient, a spin-on-glass film formed over the first oxide film, and a second oxide film formed over the spin-on-glass film the laminated insulating layer having a hole therethrough to allow electrical contact to be made to the first device element on the semiconductor substrate.

13. A semiconductor device according to claim 12, further comprising:
   (b-1) a second interlayer insulating film formed over the underlayer structure, wherein the laminated insulating layer being provided on the second insulating layer.

14. A semiconductor device according to claim 12, wherein the moisture impervious film comprises silicon nitride.

15. A semiconductor device according to claim 12, wherein the thicknesses of the first and second oxide films are about 400 nm, and the thickness of the spin-on-glass film is about 300 nm.

16. A semiconductor device according to claim 12, wherein the spin-on-glass film comprises organic spin-on-glass material.

17. A semiconductor device according to claim 12 further comprising a first metal film formed under the moisture impervious film, and the moisture impervious film directly covers the whole upper surface of the first metal film.

18. A semiconductor device, comprising:
   a) a semiconductor substrate;

b) an underlayer structure formed on the semiconductor substrate, the underlayer structure including a first metal layer;

c) a moisture impervious film disposed over the underlayer structure to directly cover the first metal layer of the underlayer structure, the moisture impervious film protecting the covered underlayer structure from being subjected to moisture diffusion from upward; and d) a first interlayer insulating film disposed over the moisture impervious film, the first interlayer insulating film including a first oxide film formed on and in contact with said moisture impervious film, said first oxide film being formed in a plasma ambient, a spin-coated insulating material layer having an affinity for moisture formed on said first oxide film, said spin-coated insulating layer causing downward moisture diffusion to the underlayer structure, and a second oxide film formed over said spin-coated insulating film.

* * * * *